(12) United States Patent
Pennaz et al.

(10) Patent No.: US 6,922,020 B2
(45) Date of Patent: Jul. 26, 2005

(54) ELECTROLUMINESCENT LAMP MODULE AND PROCESSING METHOD

(75) Inventors: Thomas J. Pennaz, Champlin, MN (US); Gary R. Tucholski, N. Royalton, OH (US)

(73) Assignee: Morgan Adhesives Company, Stow, OH (US)

( * ) Notice: Subject to any disclaimer, the term of this patent is extended or adjusted under 35 U.S.C. 154(b) by 192 days.

(21) Appl. No.: 10/175,194

(22) Filed: Jun. 19, 2002

(65) Prior Publication Data

US 2003/0234620 A1 Dec. 25, 2003

(51) Int. Cl.$^7$ .......................... G09G 37/00; H01J 63/04
(52) U.S. Cl. .................................. 315/169.3; 313/506
(58) Field of Search .......................... 315/169.1, 169.2, 315/169.3, 169.4; 313/502, 503, 506, 509, 510; 40/544

(56) References Cited

U.S. PATENT DOCUMENTS

| | | | |
|---|---|---|---|
| 3,312,851 A | 4/1967 | Flowers et al. ............. 313/108 |
| 3,784,414 A | 1/1974 | Macaulay et al. .......... 136/175 |
| 3,889,357 A | 6/1975 | Millard et al. ................ 29/570 |
| 4,064,288 A | 12/1977 | Shah et al. .................... 427/58 |
| 4,105,807 A | 8/1978 | Arora ........................... 427/126 |
| 4,159,559 A | 7/1979 | Robinson, Sr. ............ 29/25.14 |
| 4,277,974 A | 7/1981 | Karr et al. ..................... 73/339 |
| 4,417,174 A | 11/1983 | Kamijo et al. ............... 313/502 |
| 4,634,934 A | 1/1987 | Tohda et al. ................ 315/169 |
| 4,665,342 A | 5/1987 | Topp et al. .................. 313/505 |
| 4,666,576 A | 5/1987 | Pliefke ........................ 204/129 |
| 4,684,353 A | 8/1987 | deSouza ....................... 445/51 |
| 4,721,883 A | 1/1988 | Jacobs et al. ................ 313/505 |
| 4,757,235 A * | 7/1988 | Nunomura et al. ......... 313/509 |
| 4,767,965 A | 8/1988 | Yamano et al. ............. 313/491 |
| 4,816,717 A | 3/1989 | Harper et al. ................ 313/502 |
| 4,880,661 A | 11/1989 | Endo et al. .................... 427/38 |
| 4,904,901 A | 2/1990 | Simoportos et al. ........ 313/509 |
| 4,983,497 A | 1/1991 | Gilson et al. ................ 430/272 |
| 4,999,936 A | 3/1991 | Calamia et al. ............... 40/544 |
| 5,013,967 A | 5/1991 | Hirotaka et al. ............ 313/512 |
| 5,245,516 A | 9/1993 | de Haas et al. ............. 362/108 |
| 5,259,778 A | 11/1993 | Zhang ........................ 439/188 |
| 5,260,161 A | 11/1993 | Matsumura et al. ........ 430/161 |
| 5,264,714 A | 11/1993 | Nakaya et al. ................ 257/78 |

(Continued)

OTHER PUBLICATIONS

"EL Technology Provides Innovative Dashboard Lighting for Italian Sports Car" (A Dupont application profile—H78295 Mar. 1999).

"Dupont Luxprint Electroluminescent Inks" (L 11263 Nov. 1997 Dupont Photopolymer and Electronic Materials).

"Let There Be Light: Screen Printing EL Lamps for Membrane Switches" Ken Burrows of EL Specialists, Inc. as printed in the Jan., 1999 issue of "Screen Printing".

*Primary Examiner*—Wilson Lee
*Assistant Examiner*—Minh Dieu A
(74) *Attorney, Agent, or Firm*—Barnes & Thornburg LLP; Mark Hagedorn; Timothy J. Engling

(57) ABSTRACT

The present invention is an EL lamp module and a method of producing an EL lamp module. The EL lamp module of the present invention provides both an EL lamp (attachable or printed) and required electrical components for the proper function of the EL lamp in a single structure, thereby eliminating the necessity of separate electrical and mechanical connections for the final application of an EL lamp. The EL lamp module includes a printed circuit pattern and printed electrical components, and/or electrical components that may be connected through conventional printing techniques utilizing conductive and non-conductive pressure sensitive adhesives.

69 Claims, 7 Drawing Sheets

U.S. PATENT DOCUMENTS

| | | | |
|---|---|---|---|
| 5,268,827 A | 12/1993 | Granneman et al. | 362/156 |
| 5,279,641 A | 1/1994 | Narisawa et al. | 75/353 |
| 5,332,946 A | 7/1994 | Eckersley et al. | 313/506 |
| 5,359,261 A | 10/1994 | Kondo et al. | 313/509 |
| 5,410,217 A | 4/1995 | LaPointe | 313/509 |
| 5,471,773 A | 12/1995 | Hoffman | 40/544 |
| 5,482,614 A | 1/1996 | Kondo et al. | 205/171 |
| 5,494,699 A | 2/1996 | Chung | 427/66 |
| 5,533,289 A | 7/1996 | Hoffman | 40/544 |
| 5,552,668 A | 9/1996 | Hirose et al. | 313/506 |
| 5,573,807 A | 11/1996 | LaPointe | 427/66 |
| 5,597,183 A | 1/1997 | Johnson | 283/83 |
| 5,598,058 A | 1/1997 | LaPointe | 313/503 |
| 5,621,274 A | 4/1997 | McGuigan | 313/512 |
| 5,621,991 A | 4/1997 | Gustafson | 40/544 |
| 5,643,685 A | 7/1997 | Torikoshi | 428/690 |
| 5,667,417 A | 9/1997 | Stevenson | 445/24 |
| 5,680,160 A | 10/1997 | LaPointe | 345/173 |
| 5,726,953 A | 3/1998 | LaPointe et al. | 368/67 |
| 5,770,920 A | 6/1998 | Eckersley et al. | 313/506 |
| 5,779,346 A | 7/1998 | Burke | 362/84 |
| 5,780,965 A | 7/1998 | Cass et al. | 313/506 |
| 5,789,860 A | 8/1998 | Inoguchi et al. | 313/506 |
| 5,797,482 A | 8/1998 | LaPointe et al. | 200/314 |
| 5,808,412 A | 9/1998 | Zovko et al. | 313/509 |
| 5,831,375 A | 11/1998 | Benson, Jr. | 313/110 |
| 5,880,705 A * | 3/1999 | Onyskevych et al. | 345/80 |
| 5,917,278 A | 6/1999 | Miyauchi et al. | 313/506 |
| 5,958,610 A | 9/1999 | Yonekawa et al. | 428/690 |
| 6,069,442 A | 5/2000 | Hung et al. | 313/504 |
| 6,100,478 A | 8/2000 | LaPointe et al. | 200/314 |
| 6,239,453 B1 * | 5/2001 | Yamada et al. | 257/79 |
| 2001/0018809 A1 * | 9/2001 | Heropoulos et al. | 40/544 |

\* cited by examiner

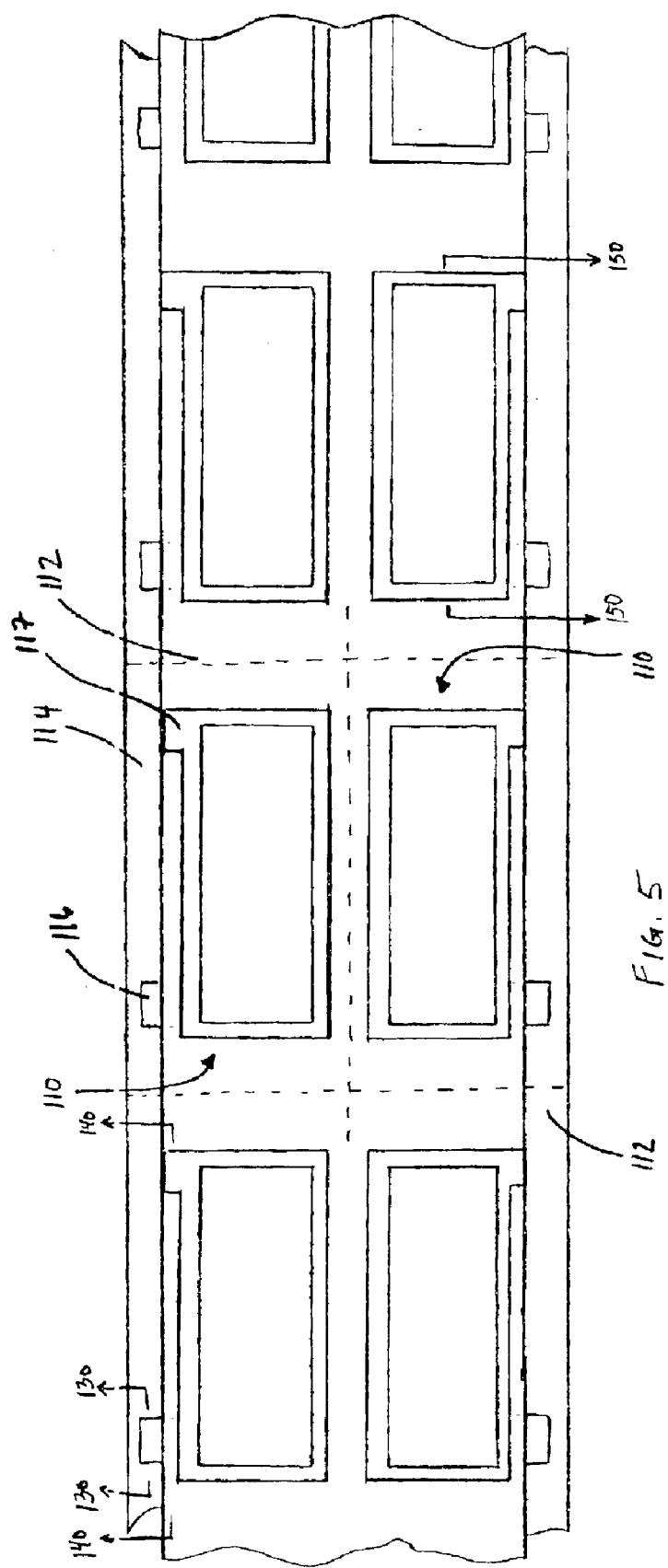

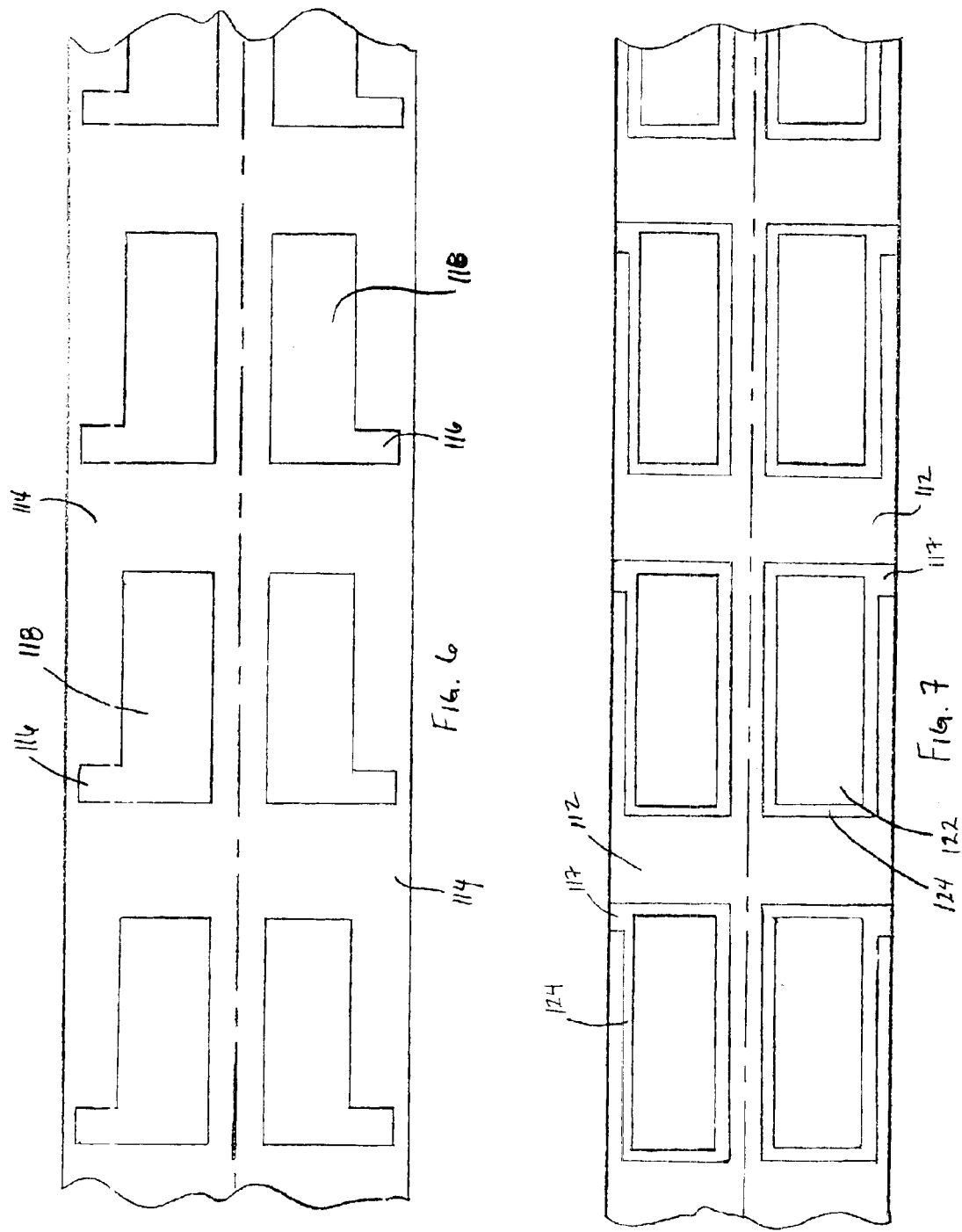

ELECTROLUMINESCENT LAMP MODULE AND PROCESSING METHOD

BACKGROUND Of THE INVENTION

The present invention relates to electroluminescent (EL) lamp modules and a method of making EL lamp modules. More particularly, an EL lamp module includes an EL lamp and a pre-printed circuit pattern that includes an EL driver and other electronic components that are printed and/or mechanically and electrically attached to the circuit pattern, by means of conductive and/or non-conductive pressure sensitive adhesives (PSA).

EL lamps are basically devices that convert electrical energy into light. AC current is passed between two electrodes insulated from each other and having a phosphorous material placed therebetween. Electrons in the phosphorous material are excited to a higher energy level by an electric field created between the two electrodes during the first quarter cycle of the AC voltage. During the second quarter cycle of the AC voltage, the applied field again approaches zero. This causes the electrons to return to their normal unexcited state. Excess energy is released in the form of light when these electrons return to their normal unexcited state. This process is repeated for the negative half of the AC cycle. Thus, light is emitted twice for each full cycle (Hz). Varying this frequency, as well as the applied AC voltage can control various properties of the emitted light. In general, the brightness of EL lamps increases with increased voltage and frequency.

EL lamps typically comprise numerous component layers. At the light-emitting side of an EL lamp (typically the top) is a front electrode, which is typically made of a transparent, conductive indium tin oxide (ITO) or antimony oxide (ATO) layer. A silver bus bar may be provided on top of a transparent or translucent electrode layer to deliver maximum and uniform current to the transparent or translucent electrode layer. Below the ITO or ATO and bus bar layers is a layer of phosphor, followed by a dielectric insulating layer and a rear lamp electrode layer. In some EL lamps, the ITO layer is sputtered on a polyester film, which acts as a flexible substrate. With a sputtered film, the transparent or translucent electrode becomes the base and the lamp can be built in the reverse order by printing the phosphor, barium and silver in that order. A relatively thick polyester film, typically four or more mils thick, is preferred because the rigidity and temperature stability that is required for screen-printing and for drying of the layers. The EL lamp construction may also include a top film laminate or coating to protect the component layers of the EL lamp construction.

The component structural layers of an EL lamp can be made from a variety of materials. Layers are normally printed by means of a flat bed screen method and are then batch dried, except for the base substrate and top film laminate. Some of the layers may be printed more than once in order to assure proper thickness and/or layer uniformity. For example, the dielectric material needs sufficient thickness to prevent continuous pinholes or voids, which may cause shorting between the electrodes. Multiple thin layers of the printed dielectric minimize the chances for a continuous pinhole through the dielectric, thus minimizing the chances of a shorted lamp. On the other hand, the dielectric layer is prone to cracking when multiple layers are printed one over the other. Thus, control over the printing process for the dielectric layer is extremely important. If the dielectric is too thick, the required operating voltage and/or frequency to achieve a given brightness will have to be increased. Also, the chances of cracking are increased when the dielectric layer becomes too thick. Thus, consistent dielectric thickness in production of EL lamps is important to ensure consistent lamp brightness across a given production run of lamps.

Operation of the EL lamp may include a power source and intervening circuitry, including such components as resistors, capacitors, diodes, inductors, inverters, and/or transformers, to function. The nominal voltage and frequency for the EL lamps described herein are typically about 100 Volts (AC) and 400 Hz. However, these EL lamps can be made for operation from approximately 65–200 Volts (AC) and 60–1000 Hz. The EL lamps can be operated directly from an AC power source or from a DC power source. If an AC power source is used directly, then a battery would not be required, nor would any other electrical components. An example of this is an EL night-light that is plugged directly to a standard house electrical system. However, if increased brightness is required, then additional electronics may be required to increase the electrical frequency of the current for the lamp. If a DC power source is used, such as small batteries, an inverter is required to convert the DC current to AC current. In larger applications, a resonating transformer inverter can be used. This typically consists of a transformer in conjunction with a transistor and resistors and capacitors. In smaller applications, such as placement on PC boards having minimal board component height constraints or for ornamental applications, an integrated circuit chip (IC) inverter can generally be used in conjunction with a diode, capacitors, resistors, inductor, and a switching arrangement.

Varying the frequency, as well as the applied AC voltage, can control various properties of the emitted light from the EL lamp. For example, the brightness in general of the EL lamp increases with increased voltage and frequency. Additionally, the color produced is greatly influenced by the lamp frequency. Unfortunately, when the operating voltage and/or frequency of an EL lamp are increased, the life of the EL lamp may decrease more rapidly. EL lamp life is often defined as the point in which the light output reaches 50% of the original output. Therefore, in addition to various other design constraints, these properties must be balanced against the desired product life of the EL lamp module to determine the proper operating voltage and/or frequency. In considering these variables, it is important to prevent voltage breakdown across the electrodes of the EL lamp, which results in lamp malfunction or failure.

EL lamps in general, and flexible EL lamps in particular, should be constructed for easy and reliable installation in the end product or application. In installation, the EL lamp must be attached mechanically and electrically in the application. Prior art EL lamps treat the mechanical installation and the electrical installation separately. The EL lamp manufacturer produces and supplies the lamp component separately from the power source and any intervening electrical components necessary for the proper operation of the EL lamp device. The manufacturer of the final part or device, or some intermediate manufacturer, then assembles or connects the lamp, circuitry and power source for the final application generally by hard connections and wiring. The conventional EL lamp driver is produced on a PCB (printed circuit board) using conventional methods, such as soldering, to attach the necessary electrical components. The power leads and driver circuit could be either a copper etched board or hard wire depending on the device and desired configuration. This increases manufacturing cycle times and increases the probability of the occurrence of manufacturing defects by utilizing separate electrical and mechanical connections in the EL lamp design.

It is therefore an object of the present invention to provide an EL lamp module and a method of producing an EL lamp module that has superior performance and is cost effective to produce.

These and other objects and advantages of the invention will be apparent from the following description, the accompanying drawings and the appended claims.

SUMMARY OF THE INVENTION

The present invention is an EL lamp module and a method of producing an EL lamp module. The EL lamp module provides both an EL lamp (attachable or printed) and electrical components for the proper function of the EL lamp in a single structure, thereby eliminating the necessity of separate electrical and mechanical connections for the final application of an EL lamp. The EL lamp module includes a printed circuit pattern and printed electrical components, and/or electrical components that may be connected through conventional printing techniques utilizing conductive and/or non-conductive pressure sensitive adhesives. The EL lamp may be printed using conventional screen printing techniques contemporaneously with the printing of the circuit pattern and application of electrical components, or in another embodiment, an EL lamp label such as those disclosed in pending application Ser. No. 09/742,490 can be pre-manufactured and applied to a base substrate of an EL module. EL labels can be easily manufactured in large quantities on a continuous release liner provided in a roll or reel form in both unidirectional light-emitting and multi-directional light-emitting forms. Thus, the present EL module is complete with required circuitry and can be manufactured in large volumes and at high speeds using commercial printing, drying, laminating, punching and blanking equipment.

In a preferred EL module, a rear lamp electrode layer and a circuit pattern are printed on the top surface of a base substrate with a suitable conductive, printable material, such as with silver or carbon ink or combinations of both. The base substrate could be any printable material that is opaque or transparent and is of sufficient strength and is electrically non-conductive and possesses the proper thermal properties for drying the inks in the printing process. The circuit pattern is designed to be the 'wiring' between electrical components of the EL module that are applied subsequently. A dielectric layer, such as barium titanate, can be printed over the rear lamp electrode. Several layers of the printed dielectric may be necessary to achieve a desired thickness of the dielectric layer. A phosphor layer can be printed or applied on the dielectric layer. A transparent or translucent top lamp electrode layer, such as ITO or ATO, is printed on the phosphor layer. A top bus bar layer having a top electrode contact is pattern printed with a silver or carbon ink or combination of both. The front electrode contact is printed in register with a front electrode contact landing area of the circuit pattern, thereby placing the front bus bar and transparent or translucent front electrode in electrical communication with the circuit pattern. Printable electrical components, such as resistors, capacitors and batteries, if required, can be printed in the appropriate areas of the circuit pattern. A conductive pressure sensitive adhesive layer can be printed on the circuit pattern, in appropriate regions, to provide for the mechanical and electrical connection of non-printable electrical components, such as a battery holder, diodes, or inverter chip. Preferably, a non-conductive pressure sensitive layer is printed on the circuit pattern in areas other than the conductive PSA to aid in the mechanical securing of any non-printable electrical components.

In another embodiment, a circuit pattern and electrical components are applied to the base substrate as described above. The EL lamp structure comprises a pre-constructed label that is applied to the substrate by conductive and/or non-conductive pressure sensitive adhesives from a continuous release liner. The pre-constructed EL label is applied such that the front and rear electrode leads register with preprinted complimentary landing areas included in the printed circuit pattern. If the desired EL lamp is double-sided (multi-directional light-emitting), then the EL module substrate (base substrate) must be transparent or translucent. When a multi-directional EL lamp label is used, it may contain a clear film dielectric such as capacitor grade 48 gauge polyester, as its printing substrate. In this situation, the lamp contacts are on the opposite sides of the film substrate. For this reason, when it is applied to the EL module substrate, the electrical contact for the top electrode is treated differently than is the case for the unidirectional lamps. Various techniques are known in the art for this contact. One such method is a through hole-contact or through-hole printing, where a hole is provided through the lamp contact and clear film dielectric, then a conductive ink and/or adhesive is printed and/or applied in the hole, which will allow the top electrode to make contact with the pre-printed lamp contact on the EL module substrate.

BRIEF DESCRIPTION OF THE DRAWINGS

FIG. 5 is a top view of EL lamps on a continuous web, wherein each EL lamp includes a thin film dielectric, and both rear lamp electrode contact and top lamp electrode contact are exposed on the same side of the thin film dielectric.

FIG. 6 is a top view of a partial structure of the lamps shown in FIG. 5.

FIG. 7 is a top view of a partial structure of the lamps shown in FIG. 5.

DETAILED DESCRIPTION OF THE INVENTION

While the present invention will be described fully hereinafter with reference to the accompanying drawings, in which a particular embodiment is shown, it is to be understood at the outset that persons skilled in the art may modify the invention herein described while still achieving the desired result of this invention. Accordingly, the description that follows is to be understood as a broad informative disclosure directed to persons skilled in the appropriate art and not as limitations of the present invention.

Figure 1:
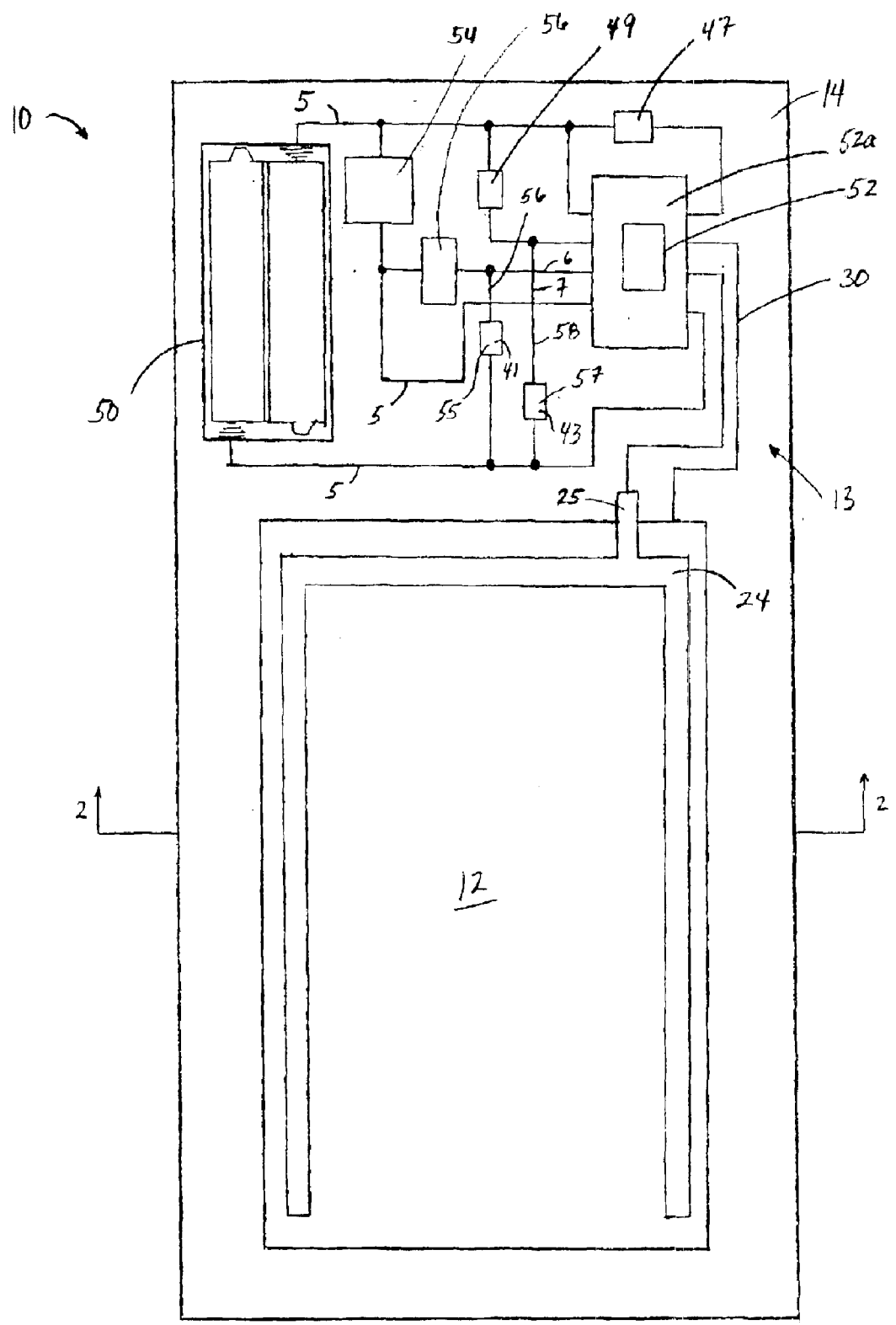
FIG. 1 shows a top view of an EL lamp module.

FIG. 1 shows an EL lamp module 10 that includes a unidirectional EL lamp 12 and an EL lamp circuit 13. The EL lamp circuit 13 includes the necessary electrical components required for the desired operation characteristics of the EL lamp 12 and a circuit pattern 30 that operates as the electrical connection or electrical leads 5 between any included electrical components. As shown in FIG. 1, the EL lamp circuit 13 and EL lamp 12 are on the same side of the base substrate 14, however, it is envisioned that at least a portion of the components could be on opposite sides and electrically connected via known techniques, such as through-hole printing.

Figure 2:
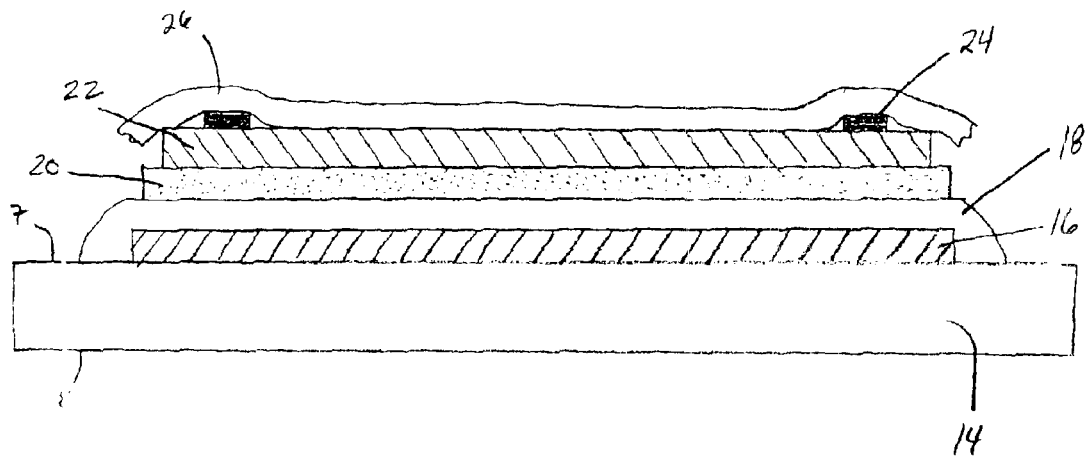
FIG. 2 is a section view taken along section line 2—2 of FIG. 1.

As shown in the section view of FIG. 2 taken along section line 2—2 of FIG. 1, the EL lamp module 10 includes a base substrate 14 having a top surface 7 and bottom surface 8. The base substrate 14, such as a polyester or polypropylene film, acts as a structural substrate for the remaining layers and electrical components of the EL lamp module 10. Other materials that may make acceptable base substrates include polycarbonate, polyethylene and film laminates including printed substrates. If the desired EL lamp is single-sided (unidirectional light-emitting) which is the preferred construction shown in FIG. 2, non-transparent substrates, including paper, can be used as the base substrate.

A rear lamp electrode layer 16 is applied to the base substrate 14 in a region reserved for the subsequent construction of the lamp portion of the module 10. The rear lamp electrode layer 16 can be printed with silver, carbon or other conductive materials.

Figure 3:
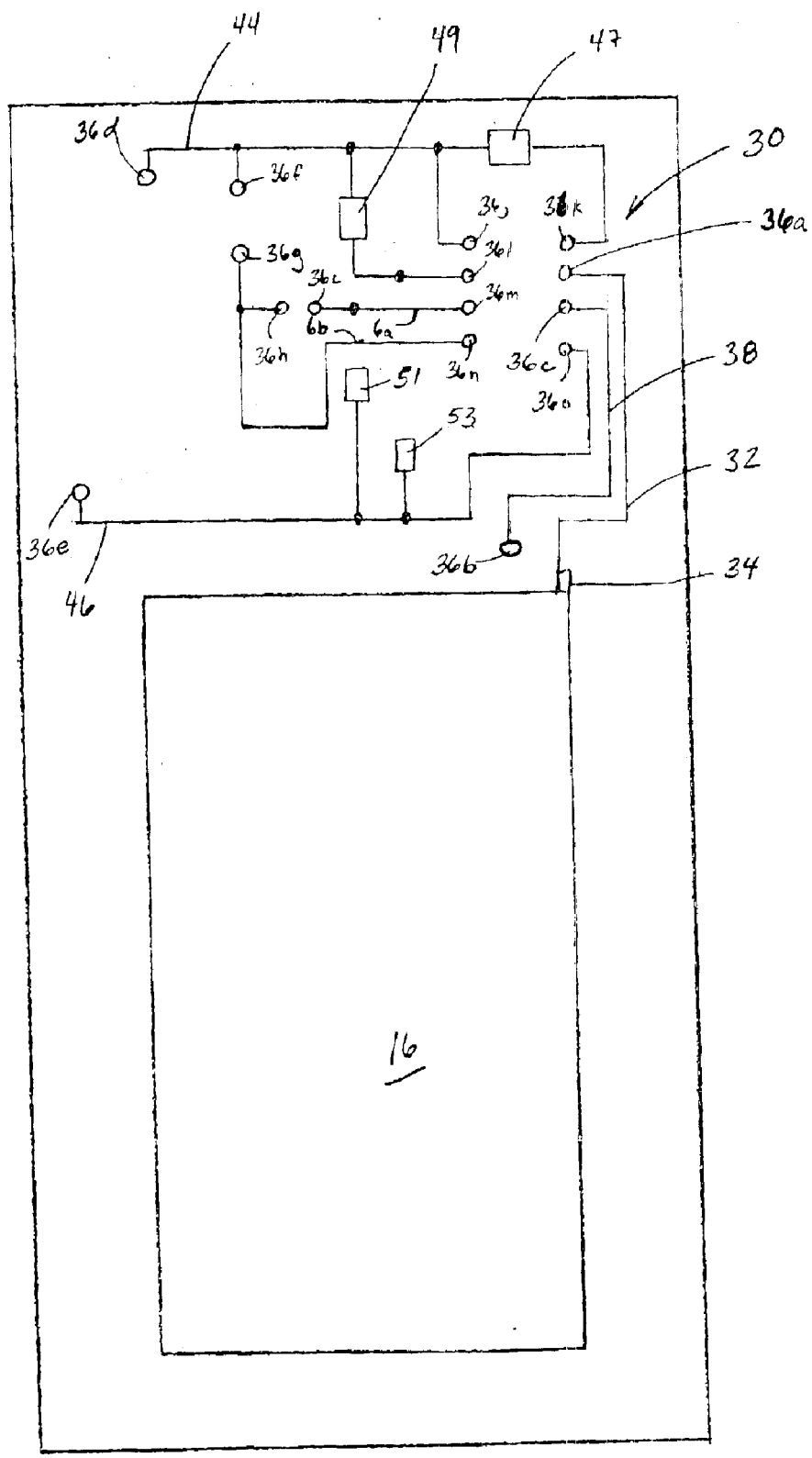
FIG. 3 is a top view illustrating a printed rear lamp electrode and circuit pattern prior to the application of other lamp layers or electrical components.

Preferably during the same printing step, the circuit pattern 30 is applied to the base substrate 14 in an area reserved for the EL lamp circuit 13. The circuit pattern 30, best shown in FIG. 3, is designed to replace the necessity of hard wiring the electrical components of the EL lamp circuit 13 in a separate manufacturing step, thus eliminating manufacturing cycle times with an easier process. The electrical connection or leads 5 between each electrical component of the EL lamp circuit 13 can be printed, preferably at the same time as the rear lamp electrode 16 is printed, and may optionally include printed electrical components, such as resistors, and landing pads 36a–o to assure easy registry with any later printed or PSA adhered components. The required electrical components are dependent on the design and operation requirements of the EL lamp 12 and are well known within the art. The circuit pattern 30 shown throughout the figures has been simplified for ease of illustration and is only meant to illustrate the principles of the invention.

The circuit pattern 30 in FIG. 3 includes a rear lamp electrode lead 32 extending from the rear electrode contact 34 and terminating in a landing pad 36a. The circuit pattern 30 further includes a transparent top lamp electrode lead 38, spaced apart from the rear lamp electrode lead 32, having ends terminating in landing pads 36b and 36c. The circuit pattern 30 includes a plurality of electrical leads 5 including a first power lead 44 and a second power lead 46 having landing pads 36d and 36e respectively. The first and second power leads 44 and 46, including landing pads 36d and 36e, are spaced apart and adapted to register with the complimentary spaced electrical contacts of an attachable power pack 50 as shown in FIG. 1. A person of ordinary skill in the art will appreciate that the shape, placement or arrangement and thickness of the electrical connections or leads 5 and landing pads 36a–o included in the circuit pattern 30 are determined by the shape/size and the electrical requirements of the additional electrical components required for the operation of the lamp 12 and that can be applied in the subsequent steps.

As shown in FIG. 3, a first resistor 47 and a second resistor 49 are optionally printed with the same conductive material as the rear lamp electrode layer 16 and circuit pattern 30, preferably during the same printing step. For example, resistors 47 and 49 may be printed by selecting the proper geometry based on the conductive ink used to print the rear lamp electrode 16 and circuit pattern 30. This may be possible when the resistor has a low resistance value and/or there is sufficient area for the resistor. If the resistive values are not compatible, then another conductive ink is preferred to arrive at the desired resistance value. If the number of resistors required in the lamp circuitry is too great, printing of the resistors becomes geometrically impractical and the required resistors are then preferably adhesively applied using the same principles as discussed further below. One skilled in the art will appreciate that the conductive ink selected may maximize the variety of functions in the present structure, including the rear lamp electrode 16, circuit pattern 30 and other electrical components, such as low value resistors. Rear capacitor electrodes 51 and 53 may optionally be printed in the appropriate positions within the circuit pattern 30 to later receive a capacitor dielectric layer (discussed further below) and top capacitor electrodes 55 and 57 to provide the required capacitance within the circuit pattern 30. It is apparent to one skilled in the art that capacitors are two parallel conductors separated by a dielectric material and that the required capacitance for the EL lamp circuit 13 could be produced by manipulating the geometry of the capacitor electrodes 51, 53, 55 and 57 and the composition and thickness of the capacitor dielectric layer. If the required capacitance is high, then the printed capacitor may be too large to be practical for use with the EL lamp module, thus adhesively attaching capacitors may be more cost and area effective, and therefore preferred. The same principles discussed herein for the attachment of other non-printable components can be used with respect to attaching capacitors.

The remaining structure of the unidirectional EL lamp 12, best illustrated in FIG. 2, is applied in the area of the rear lamp electrode layer 16. A lamp dielectric layer 18 is applied over the rear lamp electrode layer 16, preferably in an overlapping fashion to insulate the rear lamp electrode layer 16 from other layers of the EL lamp 12. A preferred material for the lamp dielectric layer 18 is a UV cured barium titanate available from Acheson Colloids, Port Huron, Mich., under the trade name EL003. Preferably in the same printing step, the lamp dielectric could also be used as the capacitor dielectric layer (not shown) is printed over the first and second rear capacitor electrodes 51 and 53 in overlapping fashion. Also, it may be desirable to pattern print a dielectric layer over portions of the circuit pattern 30 where necessary, for example, over previously printed leads 6a and 6b that are to be crossed by later printed lead 7 and that are not to be in electrical contact with the previously printed leads 6a and 6b. Care should be taken to ensure that the dielectric layer is suitable for insulating between crossover lines such that mini capacitors are not created that detract from the EL module's operation or performance. The selection of a separate insulating dielectric may be required for this purpose.

A layer of phosphor 20 is applied on the top of the lamp dielectric layer 18 that is applied on the rear lamp electrode layer 16. Printable phosphor compositions are available to emit light in many colors such as green, blue, or yellow. Phosphor compositions can also be blended or dyed with a fluoro dye to produce a white light. Typical EL phosphors can be a zinc sulfide-based material doped with the various compounds to create the desired color. Rotary screen-printing or other high-speed printing methods can print the phosphor layer 20 and other layers. The printed phosphor layer 20 should be smooth and consistent to ensure a uniform lighting effect from the excited phosphor. Preferred materials are a bluish-green (EL035A) or a white colored ink (EL036) both from Acheson Colloids, Port Huron, Mich.

A transparent top lamp electrode layer 22 is disposed on the phosphor layer 20, as shown in FIG. 2. For purposes of this disclosure, "transparent" is meant to include those materials that are fully transparent, translucent or otherwise provide for at least some light transmission. In a preferred embodiment, the transparent top lamp electrode layer 22 comprises conductive ITO or ATO. The transparent top lamp electrode layer 22 acts as one of the two parallel conductive electrodes that create the capacitance required for the excitation of the phosphor layer 20 during operation of the EL lamp 12. The emitted light is visible through the transparent top lamp electrode layer 22.

If desired, a top bus bar 24 having a top electrode contact 25 (per FIG. 1) is preferably printed on the transparent top lamp electrode layer 22. The top bus bar 24 may be printed in any geometry, such as a picture frame or goal post design, such that the light may be seen through the top transparent electrode 22. The top electrode contact 25 (FIG. 1) extends to and registers in electrical connection with the front electrode lead 38 via the landing pad 36b, which is shown in FIG. 3. The top bus bar 24 can be printed with a carbon, silver, or other conductive ink and may be eliminated if desired or if unnecessary.

Usually, the larger the lamp, the greater the need for a bus bar to allow for uniform current distribution over the electrode.

Optionally, in the same printing step with the top bus bar 24 first and second top capacitor electrodes 55 and 57 and first and second capacitor leads 56 and 58 can be printed with the conductive material to complete the first and second capacitors 41 and 43 and to electrically connect them to the rest of the circuit pattern 30.

The remaining structure of the EL lamp circuit 13 is applied to the circuit pattern 30 utilizing conductive and non-conductive adhesives. Pressure sensitive adhesives are preferred, but other adhesives can be used. A conductive pressure sensitive adhesive (PSA) is applied to the landing pads 36a–o shown in FIG. 3. The landing pads 36a–o comprise extended areas of conductive material that reduce the precision necessary, in the later printing or adherence of electrical components, for the electrical components to register in electrical contact. Optionally, a non-conductive PSA is disposed on the circuit pattern 30 in areas designed to receive electrical components, except in the area of the conductive PSA, to aid in the mechanical attachment of the electrical components. A DC power pack 50, may be applied with high-speed conventional equipment, and is applied such that the electrical contacts of the power pack 50 register with the conductive PSA coated landing pads 36d and 36e.

An IC inverter chip 52 may be applied such that the chip's electrical contacts register with the conductive PSA disposed on landing pads 36a, 36c and 36j–o. Preferably, the IC inverter chip 52 is mechanically and electrically attached utilizing interposer technology such as that taught by European Patent Publication No. EP 1 039 543 A2, incorporated herein in its entirety. The interposer technology provides a larger electrical contact area than IC inverter chips 52 precisely aligned for direct placement without an interposer 52a and therefore reduces the accuracy required for placement of IC inverter chips 52 during manufacture while still providing effective electrical connection. Also, the interposer 52a advantageously has a geometric shape, such as a square or rectangle, that allows for ease of insertion by a standard press head. Preferably, numerous interposer-IC inverter chip sub-assemblies are prepared for subsequent attachment to the circuit pattern 30 at high line speeds. Also, use of the interposer technology provides for the additional step of detecting defects on the IC inverter chips 52 on the interposer 52a that can be performed before applying the sub-assembly to the EL lamp module 10, and if defects are detected, the defective IC-interposer sub-assembly may be skipped. An inductor 54 and diode 56 can be adhered using the same principles, as outlined above, to complete the EL lamp circuit 13.

The non-conductive PSA applied to the circuit pattern 30 aids in the mechanical attachment of the non-printable module components, while the conductive PSA ensures electrical conductivity and also secures the respective component to the module. To complete the circuitry and to allow the IC inverter chip 52 to operate, other electric components that include resistors, capacitors, inductors, switches and diodes may be attached to the circuit and/or printed as part of the circuit. These components, when required, can be affixed using the same principles as outlined above for the IC inverter chip using interposer technology or direct adhesive contact.

Figure 4A:
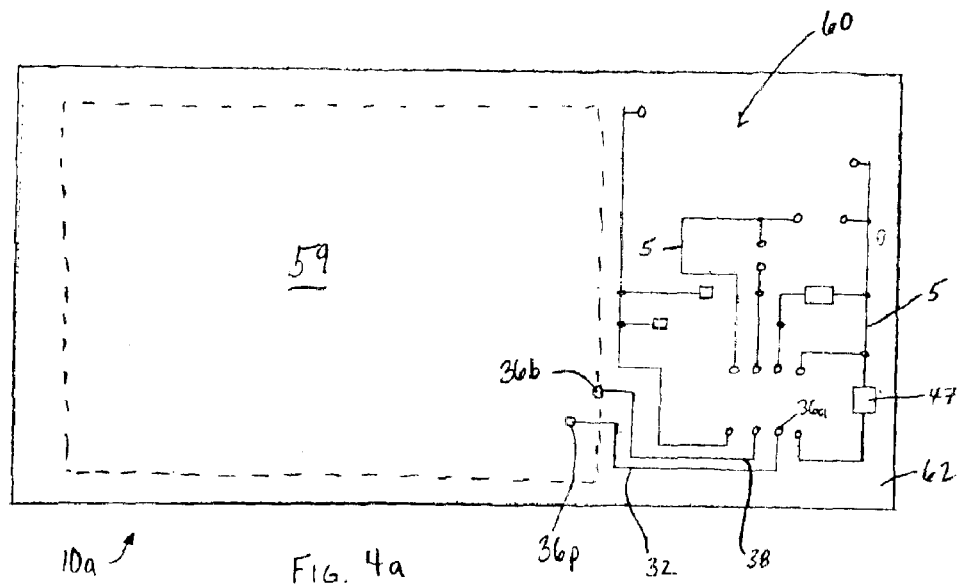
FIG. 4a is a top view of an alternate embodiment having a printed circuit pattern and adapted to receive an EL lamp label.
Figure 4B:
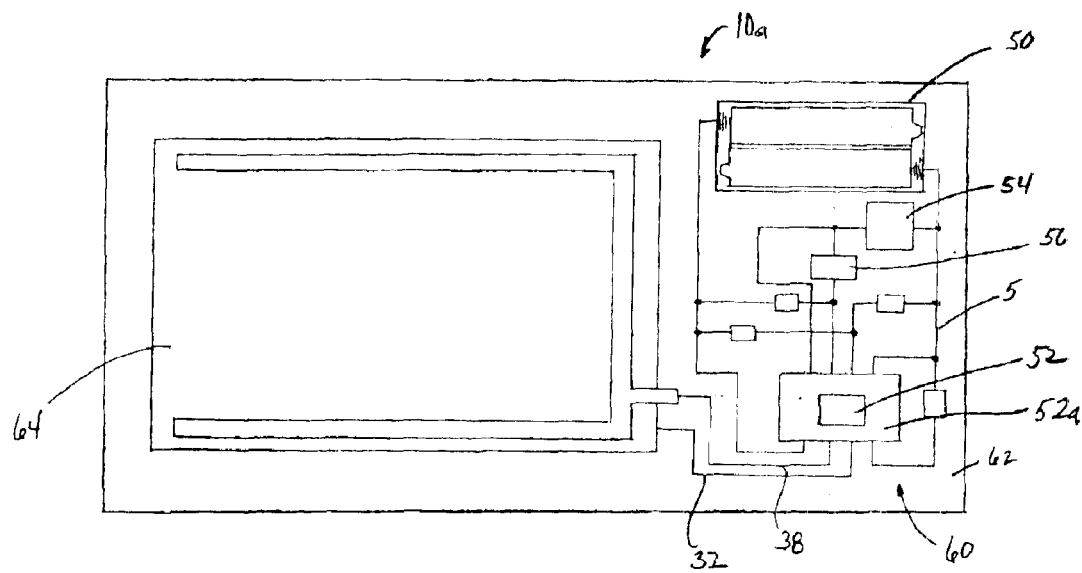
FIG. 4b is a top view of an alternate embodiment having a printed circuit pattern and a pre-manufactured EL lamp label.

An alternate embodiment, EL lamp module 10a, is shown in FIGS. 4a and 4b. Circuit pattern 60 including leads and landing pads for the later addition of components is first printed or applied on base substrate 62 as outlined for the previously discussed embodiment. A unidirectional EL lamp label 64 is applied to the base substrate 62 in an area 59 reserved for the EL lamp label 64. The electrode contacts of the label 64 register with the previously printed, complimentary electrical leads 38 and 32 of the circuit pattern. The unidirectional EL lamp label 64 can be fed off a continuous release liner as is commonly done in the conventional label industry.

In an alternate embodiment, the EL lamp label 64 may use a film for the dielectric layer, thus eliminating the printing of arguably the most critical and possibly the most difficult layer to print. Preferred EL lamp labels incorporating a film dielectric layer are disclosed in U.S. patent application Ser. No. 09/742,490, incorporated herein in its entirety. A PET film is preferred, but polypropylene is acceptable where the factors of film thickness and the dielectric constant are balanced to select the desired film. A flexible dielectric film such as Dupont Teijin Film Polyester Grade C (24–48 gauge) is rigid enough to act as a substrate. Additionally, Dupont Teijin Film Polyester Grade C possesses suitable dielectric properties for EL lamp applications. Depending on various design parameters, the light output will vary considerably relative to the thickness of the dielectric layer and its dielectric constant at a given operating voltage and frequency. Typically, a thicker printed dielectric layer or a dielectric film, both of which have low dielectric constants will require a higher operating voltage and/or higher frequency to achieve a given lamp brightness. In any given EL lamp design, it is important to maintain an effective dielectric layer to prevent voltage breakdown between the electrodes of the EL lamp, which results in lamp malfunction and/or failure. A dielectric film gives good protection against this possible failure.

Previous EL lamp labels incorporating a thin film dielectric layer, such as those disclosed in U.S. patent application Ser. No. 09/742,490, have front and rear electrode contacts on opposite sides of the dielectric film and cannot both be placed directly in electrical contact with the pre-printed circuit pattern. Since use of known EL lamp labels having a thin film dielectric layer necessitates that the electrode contacts of the front and rear electrode layers (or bus bars) be on opposite sides of the dielectric film, use of such labels require a special contact system, such as through-hole printing. Through-hole printing enables electric contact by providing a hole, through both the desired electrode contact and dielectric film layer, which is later (after applying the label to the EL module substrate) at least partially filled with a conductive material. The later filled conductive material provides electrical contact with both the front contact of the lamp label and the complimentary electrode lead's landing area, which was previously printed with the circuit pattern.

Optionally, the EL lamp label 64 may only comprise a partial lamp structure, such as a rear lamp electrode/thin film dielectric/phosphor/transparent top lamp electrode layer, with a top bus bar printed after the application of the partial lamp structure. The top bus bar would be printed such that the bus bar extends past the outer periphery of the film dielectric and makes contact with the appropriate lead of the previously printed circuit pattern. A partial lamp structure applied over a pre-printed rear lamp electrode, followed by the printing of a top bus bar allows for the use of a thin film dielectric layer, while eliminating the requirement of a special contact system as discussed above for labels having electrode contacts on opposite sides of the thin film dielectric substrate.

Another preferred EL lamp structure is shown in FIGS. 5 through 10. A thin film dielectric layer is used and both electrode contacts are on the same side of the lamp structure. FIG. 5 shows an EL lamp 110 that includes a support substrate 114 and a thin film dielectric layer 112. The EL lamp 110 includes a rear electrode contact 116 and top electrode contact 117 that are positioned and exposed to contact from the same side of the support substrate 114 and the thin film dielectric 112. When in label form, this new lamp construction can be applied directly in electrical contact to a device, such as an EL lamp module, without the requirement of an additional contact system, such as the through-hole printing.

As shown in FIGS. 6 and 7, the EL lamp 110 is preferably produced by first applying a rear lamp electrode layer 118, including the rear lamp electrode contact 116 extending outwardly there from, to the support substrate 114. The support substrate 114 may be selected from the same materials disclosed for the base substrate 14 as previously discussed. If a multidirectional light-emitting lamp is to be produced, the support substrate must be transparent/translucent, or otherwise provide for the passage of the desired level of light. Preferably, the support substrate 114 is a polymeric film such as polyethylene terephthalate (PET). The rear lamp electrode layer 118 can be printed with silver, carbon or other conductive materials known in the art. If the EL lamp 110 is to be multidirectional light-emitting, a transparent conductive material should be used, such as ITO or ATO, with an optional rear bus bar (not shown). FIG. 6 depicts the formation of several rear lamp electrodes 118 on a continuous support substrate 114 for a web, which allows for the easy manufacture of the EL lamp 110 in large quantities on conventional printing, drying, laminating, punching and blanking equipment. As seen in FIG. 6, the rear electrode contact 116 extends from the rear electrode layer 118 toward the edge of the support substrate 114.

FIG. 7 depicts a separate web of thin film dielectric 112. Preferably, a PET film is used, but polypropylene and other films are acceptable where the factors of film thickness and the dielectric constant are balanced to select the desired film such as disclosed in the discussion of EL lamp label 64. A phosphor layer 120 (shown in FIG. 10) is applied to the thin film dielectric 112 complimentary in shape and size to the rear electrode layer 118. A transparent top lamp electrode layer 122, including the top lamp electrode contact 117, is disposed on the phosphor layer 120. Optionally, a top bus bar 124 of silver or carbon is applied on top of the transparent top lamp electrode layer 122, with the bus bar including an extension that acts as the top lamp electrode contact 117. If a bus bar is not used, then the extended transparent electrode contact should be coated with a highly conductive material, such as silver or carbon. The transparent top lamp electrode contact 117, or top bus bar contact as shown, preferably extends outwardly to approximately the outer edge of the thin film dielectric 112.

The thin film dielectric 112 having the phosphor layer 120 and transparent top lamp electrode layer 122 is then laminated or adhered to the rear lamp electrode 118 positioned on the support substrate 114 preferably utilizing a pressure sensitive adhesive such that the rear lamp electrode contact 116 remains exposed. A pressure sensitive adhesive may be applied to either the rear lamp electrode layer 118 or the underside of the thin film dielectric 112. As best seen in FIG. 5, the area or, in the case of a continuous web, the width of the thin film dielectric 112 is less than the area or width of the support substrate 114 such that the rear lamp electrode contact 116 remains exposed. Thus, when lamination or adhering is completed, the rear lamp electrode 116 remains exposed from the same side of both the support substrate 114 and thin film dielectric 112. Although application of the phosphor layer 120 and transparent top lamp electrode layer 122 have been illustrated as occurring prior to the lamination of the thin film dielectric 112 to the rear lamp electrode layer 118, preferably the thin film dielectric is first laminated to the rear lamp electrode layer 118, followed by the application of the phosphor layer 120 and the transparent top lamp electrode layer 122. Printing of the phosphor layer 120 and the transparent top lamp electrode layer 122 after lamination of the thin film dielectric 112 is easier from a registration standpoint for the manufacturer. Also, printing the transparent top lamp electrode layer 122 after lamination of the thin film dielectric 112 allows the top lamp electrode contact 117 to extend beyond the edge of the thin film dielectric to the edge of the support substrate 114, or to extend an equal distance as the rear lamp electrode contact 116. Care should be taken if the top electrode contact 117, or a bus bar contact, extends outwardly to the support substrate 114 to ensure that cracking will not occur at the edge of the dielectric film 112. This may be a problem in extremely flexible applications. Limiting the top electrode contact 117 to the area of the dielectric film 112 as shown would reduce or eliminate this problem.

Figure 8:
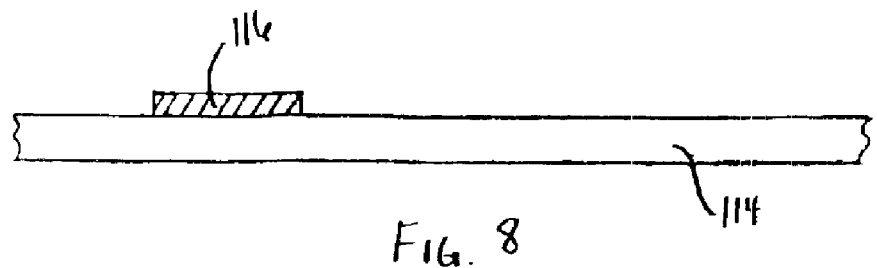
FIG. 8 is a section view taken along line 130—130 of FIG. 5.
Figure 9:
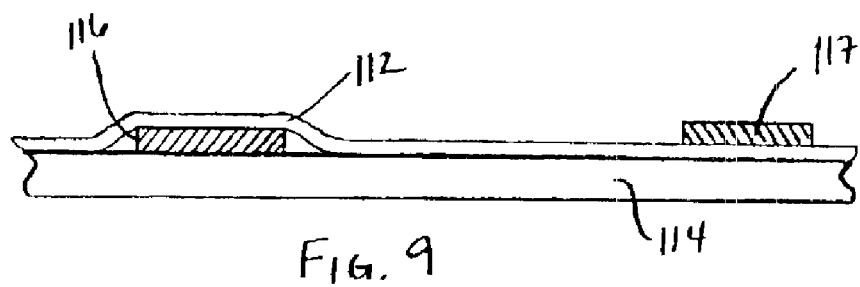
FIG. 9 is a section view taken along line 140—140 of FIG. 5.
Figure 10:
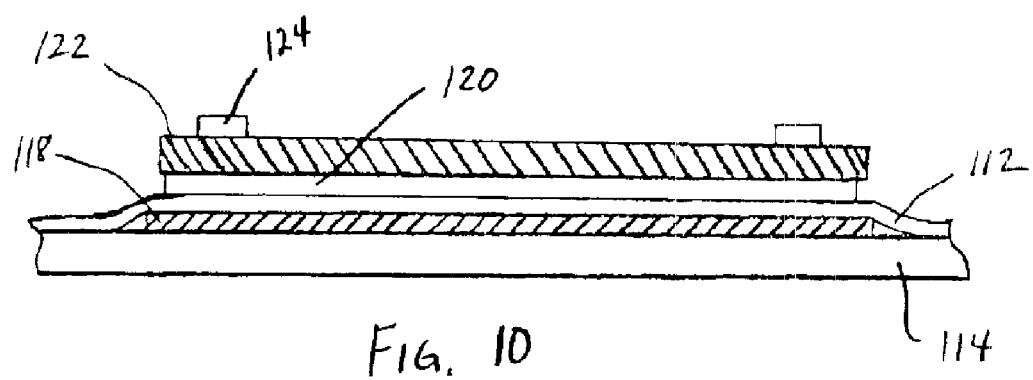
FIG. 10 is a section view taken along line 150—150 of FIG. 5.

FIGS. 8-10 depict cross sections of FIG. 5 taken at lines 130—130, 140—140 and 150—150 respectively. In a preferred embodiment, the support substrate 114 also acts as the base substrate 14 for an EL lamp module. In this case, the circuit pattern 30 and remaining components are applied to the support substrate 114 (in an area reserved therefore)

either before, contemporaneously or after constructing the EL lamp 110. The EL lamp 110 may also be produced separately and then applied to the separate base substrate 14, such as depicted in FIG. 4a, in the form of a label wherein both the rear lamp electrode contact 116 and top lamp electrode contact 117 can be placed directly in electrical contact with a pre-printed circuit pattern. When produced in label form, conductive pressure sensitive adhesive can be applied to the electrode contacts 116 and 117 and non-conductive pressure sensitive adhesive can be applied to substantially all remaining areas, or as desired for mechanically securing the label. A release liner can be then applied over the adhesive layers. The EL lamp 110 may also be formed into an adhesive label by applying a pressure sensitive adhesive to the underside of the support substrate 114 followed by a release liner.

While the EL lamp 110 was illustrated with respect to the rear lamp electrode layer 118 first applied to the support substrate 114, those skilled in the art will appreciate that a transparent support substrate may be selected and the remaining layers applied in reverse order to that above. For example, a transparent PET film is selected for the support substrate 114. A top lamp electrode bus bar is first applied thereto, followed by a transparent top lamp electrode. A phosphor layer is then applied over the transparent top lamp electrode. A thin film dielectric is laminated such that the top lamp electrode bus bar contact remains exposed. A rear lamp electrode layer is then applied to the thin film dielectric to complete the lamp structure.

Use of a thin film dielectric allows the manufacturer to ensure a continuous dielectric layer that results in many advantages. These include the following: a) fewer lamp malfunctions when compared to lamps having printed dielectric layers; b) the thin film dielectric allows the manufacturer to print layers of equal area (no overlap) thus reducing the consumption of materials and the costs associated therewith; c) improved light quality due to the smooth dielectric; d) reduced printing stations; and, e) reduced material costs for the dielectric layer.

As shown in FIG. 2, a translucent or transparent laminate, lacquer, varnish or other protective coating 26 can be applied to a portion of the top of the EL lamp area and over the entire circuit pattern except in the areas of electrical contacts. After all electrical connections are made, then these areas could also be covered to protect the consumers from the EL lamp voltages. Also, the protective coating 26 is applied to protect the EL lamp module 10 from adverse environmental conditions. A laminate or similar coating will particularly protect the phosphor layer 20 from moisture damage and the lamp as a whole from "wear and tear" encountered in normal handling. The protective layer 26 must be compatible with the previously printed layers, both when incorporated in the form of a label and when conventionally printed, so as not to cause EL lamp failures. The life and light-emitting capabilities of phosphor are reduced by exposure to moisture. Alternately, a formulation of phosphor ink that has phosphor particles encapsulated in silica can also be used to minimize moisture damage. The silica acts as a moisture barrier and does not adversely affect the light-emitting capability of the phosphor when exposed to the electric field generated between the top transparent lamp electrode layer 22 and the rear lamp electrode layer 16 of the EL lamp module 10.

Varying the frequency as well as the applied AC voltage can control various properties of the emitted light from the EL lamp 12. For example, the brightness of the EL lamp 12 increases with voltage and frequency. Unfortunately, when the operating voltage and/or frequency of an EL lamp 12 are increased, the life of the EL lamp 12 will decrease. Therefore, in addition to various other design constraints, these properties must be balanced against the desired product life of the EL lamp to determine the proper operating voltage and/or frequency. In considering these variables, it is important to prevent voltage breakdown across the lamp dielectric layer 18 of the EL lamp 12, which results in lamp malfunction or failure.

The EL lamp module 10 can be easily manufactured in large quantities on conventional printing, drying, laminating, punching and blanking equipment. The EL lamp label 64 can also be manufactured separately in large volumes and at high speeds using commercial printing, drying, laminating, punching and blanking equipment and then dispensed from a roll or web during the EL lamp module fabrication. Manufacturing the EL labels 64 can be performed on high-speed equipment that may operate at speeds of more than 100 feet (30 meters) per minute on high volume commercial printing, drying, laminating, punching, and blanking equipment. This equipment replaces the flat bed screen processing of prior methods. Such a method is suitable for high-speed processing and will require less stations and less time between steps while producing an EL lamp label 64 that is more consistent and prone to fewer problems, such as cracking or pin holes in the dielectric. The subsequent electrical and mechanical installation of the EL lamp label 64 to the base substrate of the EL lamp module can also be performed on high speed equipment and will eliminate the separate printing and drying steps required by conventionally screen printing the EL lamp on the base substrate.

While above-mentioned features of this invention and the manner of obtaining them may be apparent to understand the method of producing an EL lamp module, the inventive method of manufacturing an EL lamp module, itself, may be best understood by reference to the following description taken in conjunction with the above identified features.

A base substrate layer 14 or 114 is supplied that acts as a structural substrate for the EL lamp module 10 or 110. A rear lamp electrode and a circuit pattern of carbon, silver, or a mixture of both inks can be printed on the base substrate. The circuit pattern includes a top lamp electrode lead as well as other electrical leads that are to connect required electrical components and any desired printable component (such as resistors and rear capacitor electrodes) requiring a conductive material. The circuit pattern is printed with appropriate electrical spacing for the receipt of additional electrical components, as required by the particular module design. A lamp dielectric layer of barium titanate is printed over the rear lamp electrode to insulate the rear lamp electrode from other lamp components and over any rear capacitor electrode of a capacitor printed with the circuit pattern. Several layers may be printed to achieve the desired dielectric layer thickness. A dielectric layer, which may be the same dielectric ink as used for the EL lamps or one that is more insulating, may also be applied over other areas of the circuit pattern to protect the previously printed components, for example, to insulate particular leads from later printed or affixed components. If this material proves inefficient, then an insulative dielectric may be required. Also, it is important that the coverage area of the dielectric layer be greater than any other lamp layers or rear capacitor electrodes to protect against shorting at the perimeter of the lamp or other electrical component. A phosphor layer is applied on the lamp dielectric layer over the rear lamp electrode. If necessary, more than one layer may be applied to achieve the desired thickness of the phosphor layer.

A transparent or translucent top lamp electrode of (ITO) or (ATO) is printed over the phosphor layer. A top bus bar of silver or carbon is then pattern printed over the transparent top lamp electrode, for example, in the pattern of a football goal post, a picture frame or other geometry that would allow the light to be seen through the transparent top lamp electrode. The electrical contact of the bus bar extends beyond the perimeter of the lamp dielectric layer and registers with a landing pad of the top lamp electrode lead printed previously as part of the circuit pattern. Preferably, the top electrode of each capacitor and any remaining circuitry are printed at the same time as the bus bar utilizing the same conductive material. The above printing steps are preferred to be high-speed printing methods with flexographic printing as the preferred method.

A non-conductive adhesive can be pattern printed over a portion of the circuit pattern to preclude undesired electrical contact between the non-printable component and the circuit pattern while also increasing the adhesive strength securing the non-printable component to the module.

If not previously printed, capacitors, resistors and other printable circuit components can be printed in their respective region in the circuit pattern, registering with the appropriate landing pad connected to the appropriate lead. Non-printable components, such as the power pack, IC inverter chip, inductor, switches (such as dome and membrane switches) and diodes are applied to the module such that the component's electrical contacts register with their complimentary landing pads having conductive PSA applied to the surface thereof. Optionally, the non-printable components may have conductive PSA applied to the electrical contacts thereof in place of, or in addition to, the conductive PSA on the landing pads. The non-printable components are preferably provided in a pre-assembled component-interposer sub-assembly that may be affixed using a standard press head at high line speeds.

A varnish can be applied or a translucent top film can be laminated over the module to encapsulate and protect the underlying components. A varnish protective layer would add another printing step, but is generally preferred to an overlaminate film.

In an alternate method, a pre-manufactured adhesive EL lamp label is used instead of printing the EL lamp on the base substrate. The circuit pattern is printed on the base substrate as previously disclosed. The circuit pattern includes a rear electrode lead having a rear electrode landing pad and a top electrode lead having a top electrode landing pad. The pre-manufactured EL lamp label is fed off a release liner and applied to the base substrate in the area reserved for the EL lamp such that the EL lamp rear electrode contact registers in electrical contact with the rear electrode landing pad of the circuit pattern and the EL lamp label's transparent top electrode contact registers in electrical contact with the top electrode landing pad. The adhesive backed EL lamp label can be applied to the base substrate through the use of standard labeling machines. The EL Lamp label will be secured mechanically with non-conductive PSA while the electrical contacts can be made with a conductive PSA, thereby combining the electrical and mechanical installation of the EL lamp in the same manufacturing step.

The completed El lamp module is an independent electronic device that contains an EL lamp and an electronic circuit. Optionally, the EL lamp module further includes a power source. This module then can be easily used and/or installed into other devices. Possible applications include, but are not limited to, use as a novelty lamp by insertion into packaging materials, such as department store bags or installation in decorative holiday bags, inclusion in low-cost throw-away advertisement devices, emergency light sources, games and backlighting of electronic devices.

Various features of the invention have been particularly shown and described in connection with the illustrated embodiments of the invention, however, it must be understood that these particular embodiments merely illustrate and that the invention is to be given its fullest interpretation within the terms of the appended claims.

What is claimed is:

1. An electroluminescent lamp module comprising:
   1) a base substrate having a top surface and a bottom surface;
   2) an electroluminescent lamp on the base substrate wherein the electroluminescent lamp is printed on the base substrate and comprises a rear lamp electrode layer, a dielectric layer, a phosphor layer and a transparent top lamp electrode layer; and
   3) an electroluminescent lamp circuit on the base substrate the electroluminescent lamp circuit including a circuit pattern and a plurality of electrical components; wherein the circuit pattern is printed in a predetermined pattern on the base substrate and is designed to receive later applied electrical components and the rear lamp electrode layer and transparent top lamp electrode layer being electrically connected to the circuit pattern.

2. The electroluminescent lamp module of claim 1 wherein the electroluminescent lamp further includes a top bus bar.

3. The electroluminescent lamp module of claim 1 wherein the rear lamp electrode layer and the circuit pattern are printed on the base substrate with an ink including one or more materials selected from indium tin oxide, antimony oxide, silver and carbon ink.

4. The electroluminescent lamp module of claim 1 wherein the circuit pattern includes a plurality of spaced electrical leads, at least one of the plurality of leads having a terminal landing pad capable of registering with the later applied electrical component.

5. The electroluminescent lamp module of claim 1 wherein the electroluminescent lamp circuit includes at least one printed electrical component selected from the group consisting of resistors, capacitors and batteries.

6. The electroluminescent lamp module of claim 1 wherein the electroluminescent lamp circuit includes an integrated circuit inverter chip, the integrated circuit inverter chip including a plurality of electrical contacts, the plurality of electrical contacts of the integrated circuit inverter chip being adhered to and electrically connected to a plurality of spaced electrical leads in the circuit pattern utilizing conductive adhesive.

7. The electroluminescent lamp module of claim 6 wherein the integrated circuit inverter chip is adhered to an interposer and the interposer is adhered to and electrically connected to a plurality of spaced electrical leads in the circuit pattern.

8. The electroluminescent lamp module of claim 1 wherein the plurality of electrical components is selected from the group consisting of integrated circuit inverter chips, resistors, capacitors, diodes, switches and power packs.

9. The electroluminescent lamp module of claim 1 further including a protective coating over at least a portion of the module as an outermost layer.

10. An electroluminescent lamp module comprising:
   1) a base substrate having a top surface and a bottom surface;

2) an electroluminescent lamp on the base substrate wherein the electroluminescent lamp comprises a pre-manufactured label having a rear lamp electrode contact and a transparent top lamp electrode contact; and 3) an electroluminescent lamp circuit on the base substrate the electroluminescent lamp circuit including a circuit pattern and a plurality of electrical components; wherein the circuit pattern is printed in a predetermined pattern on the base substrate and is designed to receive later applied electrical components, the label being adhered to the base substrate such that the rear lamp electrode contact and the transparent top lamp electrode contact are electrically connected to a complimentary rear lamp electrode lead and a transparent top lamp electrode lead of the circuit pattern.

11. The electroluminescent lamp module of claim 10 wherein the pre-manufactured label comprises a rear lamp electrode layer, a dielectric layer, a phosphor layer and a transparent top lamp electrode layer; wherein the rear lamp electrode layer and transparent top lamp electrode layer are electrically connected to the circuit pattern.

12. The electroluminescent lamp module of claim 11 wherein the dielectric layer comprises a film selected from the group consisting of polyethylene terephthalate and polypropylene.

13. The electroluminescent lamp module of claim 10 wherein the circuit pattern is printed on the base substrate with an ink including one or more materials selected from indium tin oxide, antimony oxide, silver and carbon ink.

14. The electroluminescent lamp module of claim 10 wherein the circuit pattern includes a plurality of spaced electrical leads, and wherein at least one of the plurality of leads includes a terminal landing pad adapted to register with the later applied electrical component.

15. The electroluminescent lamp module of claim 10 wherein the electroluminescent lamp circuit includes at least one printed electrical component selected from the group consisting of resistors, capacitors and batteries.

16. The electroluminescent lamp module of claim 10 wherein the electroluminescent lamp circuit includes an integrated circuit inverter chip, the integrated circuit inverter chip including a plurality of electrical contacts, and wherein the plurality of electrical contacts are adhered to and electrically connected to a plurality of spaced electrical leads in the circuit pattern.

17. The electroluminescent lamp module of claim 16 wherein the integrated circuit inverter chip is adhered to an interposer and the interposer is adhered to and electrically connected to a plurality of spaced electrical leads in the circuit pattern utilizing conductive pressure sensitive adhesive.

18. The electroluminescent lamp module of claim 10 wherein the plurality of electrical components are selected from the group consisting of integrated circuit inverter chips, resistors, capacitors, diodes, switches and power packs.

19. The electroluminescent lamp module of claim 10 further including a protective coating over at least a portion of the module as an outermost layer.

20. A method of making an electroluminescent lamp module having an electroluminescent lamp comprising a rear lamp electrode layer, a dielectric layer, a phosphor layer, and a top lamp electrode layer and an electroluminescent lamp circuit comprising a circuit pattern and a plurality of electrical components having a plurality of electrical contacts, the method comprising the steps of:

(1) providing a base substrate having a top surface and a bottom surface;

(2) printing the circuit pattern with a conductive material on one of the top or bottom surfaces, the circuit pattern including a plurality of electrical leads, the plurality of electrical leads adapted to electrically connect with the electrical contacts of the electrical components and with the rear lamp electrode layer and transparent top lamp electrode layer, the circuit pattern including a rear lamp electrode lead and a top lamp electrode lead;

(3) printing the electroluminescent lamp on the base substrate such that the rear lamp electrode layer is adapted to register with and be in electrical connection with the rear electrode lead and the transparent top lamp electrode layer is adapted to register with and be in electrical connection with the top lamp electrode lead; and (4) electrically connecting the plurality of electrical components to the circuit pattern by adhering with conductive adhesive.

21. The method of claim 20 wherein the electroluminescent lamp further includes a top bus bar, the top bus bar being printed on the transparent top lamp electrode layer and extending beyond the transparent top lamp electrode layer and registering in electrical connection with the top lamp electrode lead.

22. The method of claim 20 wherein the rear lamp electrode layer and the circuit pattern are printed during the same printing step.

23. The method of claim 20 wherein the conductive adhesive is pattern printed over portions of the circuit pattern prior to electrically connecting the plurality of electrical components.

24. The method of claim 20 wherein the plurality of electrical components includes at least one printed component selected from the group consisting of transistors, capacitors and batteries.

25. The method of claim 20 further comprising the step of printing a non-conductive pressure sensitive adhesive over areas of the circuit pattern that are not to make electrical contact with the plurality of electrical components.

26. The method of claim 20 wherein the electroluminescent lamp circuit and the electroluminescent lamp are on separate sides of the base substrate, the electrode layers and electrode leads being electrically connected by way of through-hole printing.

27. The method of claim 20 wherein the plurality of electrical components is selected from the group consisting of transistors, capacitors, diodes, batteries and integrated inverter chips.

28. The method of claim 20 wherein at least one of the plurality of electrical components is an integrated circuit inverter chip.

29. The method of claim 28 wherein the integrated circuit inverter chip is part of an inverter chip-interposer sub-assembly.

30. The method of claim 29 wherein the step of electrically connecting the plurality of electrical components to the circuit pattern is performed with respect to the inverter chip-interposer sub-assembly by locating the inverter chip-interposer sub-assembly over a portion of the circuit pattern and electrically connecting the inverter chip-interposer sub-assembly to the circuit pattern by placing the inverter chip-interposer sub-assembly in contact with the circuit pattern by way of conductive pressure sensitive adhesive.

31. The method of claim 20 wherein the dielectric layer is a thin film selected from the group consisting of polyethylene terephthalate and polypropylene.

32. A method of making an electroluminescent lamp module, the module having an electroluminescent lamp comprising a rear lamp electrode layer, a dielectric layer, a phosphor layer, and a transparent top lamp electrode layer and an electroluminescent lamp circuit comprising a circuit pattern and a plurality of electrical components, the plurality of electrical components each having electrical contacts, the method comprising the steps of:

(a) providing a base substrate having a top surface and a bottom surface;

(b) printing the circuit pattern with a conductive material on one of the top or bottom surfaces, the circuit pattern including a plurality of electrical leads, the plurality of electrical leads adapted to electrically connect with the electrical contacts, the rear lamp electrode layer and the transparent top lamp electrode layer, the circuit pattern including a rear lamp electrode lead and a top lamp electrode lead;

(c) applying at least a partially pre-constructed label to the base substrate to form said electroluminescent lamp; and (d) electrically connecting the plurality of electrical components to the circuit pattern by adhering with conductive adhesive.

33. The method of claim 32 wherein the rear lamp electrode layer is printed on the base substrate during the same printing step as the circuit pattern.

34. The method of claim 32 wherein the electroluminescent lamp further includes a top bus bar, the top bus bar being printed on the transparent top lamp electrode layer and extending beyond the transparent top lamp electrode layer and registering in electrical connection with the top lamp electrode lead.

35. The method of claim 32 wherein the conductive adhesive is pattern printed over portions of the circuit pattern prior to electrically connecting the plurality of electrical components.

36. The method of claim 32 wherein the plurality of electrical components includes at least one printed component selected from the group consisting of transistors, capacitors and batteries.

37. The method of claim 32 further comprising the step of printing a non-conductive pressure sensitive adhesive over areas of the circuit pattern that are to make electrical contact with the plurality of electrical components to aid in the mechanical attachment of the plurality of electrical components.

38. The method of claim 32 wherein the electroluminescent lamp circuit and the electroluminescent lamp are on separate sides of the base substrate, the lamp electrode layers and electrode leads being electrically connected by way of through-hole printing.

39. The method of claim 32 wherein the plurality of electrical components are selected from the group consisting of transistors, capacitors, diodes, batteries and integrated inverter chips.

40. The method of claim 32 wherein at least one of the plurality of electrical components is an integrated circuit inverter chip.

41. The method of claim 40 wherein the one integrated circuit inverter chip is part of an inverter chip-interposer sub-assembly.

42. The method of claim 41 wherein the step of electrically connecting the plurality of electrical components to the circuit pattern is performed with respect to the inverter chip-interposer sub-assembly by locating the inverter chip-interposer sub-assembly over a portion of the circuit pattern and electrically connecting the inverter chip-interposer sub-assembly to the circuit pattern by placing the inverter chip-interposer sub-assembly in contact with the circuit pattern, the portion of the circuit pattern having a printed layer of conductive pressure sensitive adhesive disposed thereon.

43. An electroluminescent label that can be mechanically applied and electrically connected to a surface with pressure sensitive adhesive, the label comprising:

a support substrate having a top surface and a bottom surface;

a rear lamp electrode layer on the top surface of the support substrate;

a thin film dielectric on a portion of the rear lamp electrode layer, the thin film dielectric positioned such that a portion of the rear lamp electrode remains exposed on the top surface of the support substrate;

a phosphor layer on the thin film dielectric;

a top lamp electrode layer on the phosphor layer, the top lamp electrode layer including a top lamp electrode contact;

a conductive adhesive on the exposed portion of the rear lamp electrode and the top lamp electrode contact; and a non-conductive adhesive on a portion of the top lamp electrode layer except for the top lamp electrode contact.

44. The electroluminescent label of claim 43, wherein the thin film dielectric comprises a polymeric film.

45. The electroluminescent label of claim 44, wherein the polymeric film is polyethylene terephthalate.

46. The electroluminescent label of claim 43 further comprising a release liner over the adhesives.

47. The electroluminescent label of claim 43 further comprising a top lamp electrode bus bar on the top lamp electrode layer, the top lamp electrode bus bar including a top bus bar contact having conductive pressure sensitive adhesive thereon.

48. The electroluminescent label of claim 43, further comprising a rear lamp electrode bus bar.

49. The electroluminescent label of claim 43, wherein both lamp electrode layers are transparent.

50. The electroluminescent label of claim 43, further comprising transparent lacquer on the top lamp electrode and non-conductive pressure sensitive adhesive on the transparent lacquer.

51. A method of making a thin film dielectric electroluminescent label comprising the steps of:

providing a support substrate having a top surface and a bottom surface;

depositing a rear lamp electrode layer on the top surface of the support substrate, the rear lamp electrode layer including a rear lamp electrode contact;

laminating a thin dielectric film to the rear lamp electrode layer such that the rear lamp electrode contact remains uncovered;

depositing a phosphor layer on the thin film dielectric;

depositing a top lamp electrode layer on the phosphor layer;

depositing a top lamp electrode bus bar in a pattern on the top lamp electrode layer, the top lamp electrode bus bar including a top bus bar contact;

applying a conductive adhesive on the contacts; and applying a non-conductive adhesive on areas other than the contacts, wherein at least one of the rear and top lamp electrodes is transparent.

52. The method of claim 51, wherein the rear lamp electrode layer, the phosphor layer and the top lamp electrode layer are deposited with flexographic printing.

53. The method of claim 51, wherein the top lamp electrode layer is transparent.

54. The method of claim 51, wherein the thin film dielectric is a polymeric film.

55. The method of claim 54, wherein the polymeric film is polyethylene terephthalate.

56. The method of claim 51, further comprising the step of applying a release liner over the adhesives.

57. The method of claim 51, further comprising the step of depositing a rear lamp electrode bus bar on the support substrate prior to depositing the rear electrode layer, the rear electrode layer comprising a transparent conductive material.

58. An electroluminescent label that can be mechanically applied and electrically connected to a surface with pressure sensitive adhesive, the label comprising:
   a support substrate having a top surface and a bottom surface;
   a bottom bus bar on the support substrate;
   a transparent lamp electrode layer on the bottom bus bar;
   a phosphor layer on the transparent lamp electrode layer;
   a thin film dielectric layer applied over the phosphor layer such that a portion of at least the bottom bus bar remains uncovered;
   a rear lamp electrode layer on the thin film dielectric; and
   a conductive adhesive on the exposed portion of the bottom bus bar and at least a portion of the rear lamp electrode layer.

59. The electroluminescent label of claim 58, wherein the thin film dielectric is a polymeric film.

60. The electroluminescent label of claim 59, wherein the polymeric film is polyethylene terephthalate.

61. The electroluminescent label of claim 58 further comprising a release liner over the adhesive.

62. The electroluminescent label of claim 58 further comprising a non-conductive adhesive pattern on areas of the label other than those covered by conductive adhesive.

63. The electroluminescent label of claim 58 further comprising a rear lamp electrode bus bar on the rear lamp electrode layer, the rear lamp electrode layer comprising a transparent conductive material.

64. A method of making an electroluminescent lamp module having an electroluminescent lamp comprising a rear lamp electrode layer, a dielectric layer, a phosphor layer, and a top lamp electrode layer and an electroluminescent lamp circuit comprising a circuit pattern and a plurality of electrical components having electrical contacts, the method comprising the steps of:
   (a) providing a base substrate having a top surface and a bottom surface;
   (b) printing the circuit pattern with a conductive material on one of the top or bottom surfaces, the circuit pattern including a plurality of electrical leads, the plurality of electrical leads adapted to electrically connect with the electrical contacts of the electrical components and with the rear lamp electrode layer and top lamp electrode layer, the circuit pattern including a rear lamp electrode lead and a top lamp electrode lead;
   (c) printing the rear lamp electrode layer on the base substrate;
   (d) applying the dielectric layer as a thin polymeric film over the rear lamp electrode layer;
   (e) printing the phosphor layer on the thin polymeric film dielectric;
   (f) printing the top lamp electrode layer on the phosphor layer; and
   (g) electrically connecting the plurality of electrical components to the circuit pattern by adhering with conductive adhesive.

65. The method of claim 64 wherein the electroluminescent lamp further includes a top bus bar, the top bus bar being printed on the top lamp electrode layer, the top lamp electrode layer comprising a transparent conductive material.

66. The method of claim 64 wherein the thin polymeric film is selected from the group consisting of polyethylene terephthalate and polypropylene.

67. The method of claim 64 wherein the electroluminescent lamp is formed by (a) printing a bottom bus bar on the base substrate, (b) printing the top electrode layer over the bottom bus bar, (c) printing the phosphor layer over the top electrode layer, (d) applying the dielectric layer in the form of a thin polymeric film over the phosphor layer, and (e) printing the rear electrode layer on the thin polymeric film.

68. An electroluminescent lamp comprising:
   a support substrate having a top surface and a bottom surface;
   a printed circuit Pattern on said support substrate;
   a rear lamp electrode layer on the top surface of the support substrate;
   a thin film dielectric on the rear lamp electrode layer, the thin film dielectric applied such that a portion of the rear lamp electrode layer remains exposed on the top surface of the support substrate;
   a phosphor layer on the thin film dielectric; and
   a top lamp electrode layer on the phosphor layer, the top lamp electrode layer including a top lamp electrode contact, wherein said rear lame electrode layer, said thin film dielectric, said phosphor layer and said top lamp electrode are printed on said support substrate and said top lamp electrode layer and said rear lamp electrode layer are electrically connected to said circuit pattern.

69. An electroluminescent lamp comprising:
   a support substrate having a top surface and a bottom surface;
   a printed circuit pattern on said support substrate;
   a bottom bus bar on the support substrate;
   a transparent lamp electrode layer on the bottom bus bar;
   a phosphor layer on the transparent lamp electrode layer;
   a thin film dielectric layer laminated over the phosphor layer such that a portion of the bottom bus bar remains uncovered; and
   a rear lamp electrode layer on the thin film dielectric, wherein said bottom bus bar, said transparent lamp electrode layer, said rear lamp electrode layer, said thin film dielectric, said phosphor layer and said top lamp electrode are printed on said support substrate and said top lamp electrode layer and said rear lamp electrode layer are electrically connected to said circuit pattern.

* * * * *